(12) United States Patent
Shinyashiki et al.

(10) Patent No.: US 6,461,447 B1
(45) Date of Patent: Oct. 8, 2002

(54) SUBSTRATE FOR EPITAXIAL GROWTH

(75) Inventors: Hiroshi Shinyashiki, Tokyo (JP);
Hiroshi Koya, Tokyo (JP); Tomonori Yamaoka, Tokyo (JP); Kazuhito Matsukawa, Tokyo (JP); Yasuhiro Kimura, Tokyo (JP); Hidekazu Yamamoto, Tokyo (JP)

(73) Assignee: Mitsubish Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/607,626

(22) Filed: Jun. 30, 2000

(30) Foreign Application Priority Data

Oct. 18, 1999 (JP) .............................. 11-295869

(51) Int. Cl.⁷ .............................................. H01L 29/00
(52) U.S. Cl. ......................................................... 148/33
(58) Field of Search .................... 148/33, 33.2; 117/13, 117/35; 438/400, 477, 478

(56) References Cited

U.S. PATENT DOCUMENTS 5,296,047 A * 3/1994 Fellner
5,419,786 A * 5/1995 Kokawa et al.
5,919,302 A * 7/1999 Falster et al.
6,162,708 A * 12/2000 Tamatsuka et al.
6,228,164 B1 * 5/2001 Ammon et al.
2001/0025597 A1 * 10/2001 Falster et al.
2001/0039916 A1 * 11/2001 Mule'Stagno et al.

FOREIGN PATENT DOCUMENTS

JP 11-189493 * 7/1999

* cited by examiner

Primary Examiner—Keith Christianson
(74) Attorney, Agent, or Firm—Leydig, Voit & Mayer, Ltd.

(57) ABSTRACT

A substrate having a surface on which silicon is epitaxially grown; wherein the substrate is cut from an oxygen induced stacking fault generation area of a single crystal silicon rod grown by the Czochralski method.

3 Claims, 7 Drawing Sheets

SUBSTRATE FOR EPITAXIAL GROWTH

BACKGROUND OF THE INVENTION

The present invention relates to a substrate for epitaxial growth (hereinafter referred to as an epitaxially substrate) and a semiconductor device using such a substrate, and more specifically concerns an epitaxial substrate utilizing an OSF generation area of a silicon single crystal rod and a semiconductor device formed on such a substrate.

Japanese Unexamined Patent Publication No. Hei. 11-189493 has disclosed an epitaxial substrate used for manufacturing an epitaxial wafer.

This epitaxial substrate is a silicon wafer made from a silicon single crystal doped with nitrogen in a predetermined density, and silicon is epitaxially grown on its surface. When thermally oxidized, the wafer of this type of a silicon single crystal is subjected to the generation of OSFs (Oxidation Induced Stacking Fault), the density of which is not less than $10^2/cm^2$.

When an epitaxial layer is grown on this epitaxial substrate having OSFs, crystal defects due to the OSF nuclei serve as gettering sites during the device processes.

However, in the case of such a conventional epitaxial substrate, since the doping process using nitrogen is required, its single crystal growth process becomes complex.

Therefore, the objective of the present invention is to easily manufacture an epitaxial substrate with a higher gettering property.

SUMMARY OF THE INVENTION

The present invention, relates to an epitaxial substrate having a surface on which silicon is epitaxially grown, made of an OSF generation area of a single crystal silicon rod that has been grown by the Czochralski (CZ) method.

This OSF generation area refers to an area that is subjected to generation of OSFs in a density of not less than $10^2/cm^2$, for example, upon application of a thermal process.

The present invention, which relates to an epitaxial substrate having a surface on which silicon is epitaxially grown made of a top portion of a single crystal silicon rod that has been grown by the CZ method.

In this case, the top portion refers to a portion from a position at which a desired diameter is obtained to an OSF generation area.

The present invention, relates to an epitaxial substrate having a surface on which an epitaxial layer is stacked, made of a single crystal silicon rod that has been grown by the CZ method in such a manner that OSF defect nuclei exist in a density of $10^5$ to $3\times10^7/cm^3$ and the area having the OSF defect nuclei, formed on the wafer, accounts for not less than 25% of the total wafer area.

In this case, the OSF defect nuclei refer to defect nuclei that are supposed to form OSF defects upon application of a thermal process.

The OSF defect nuclei less than $10^5/cm^3$ results in insufficiency in the gettering property. In contrast, the OSF defect nuclei exceeding $3\times10^7/cm^3$ causes the occurrence of defects in the epitaxial layer.

The present invention relates to an epitaxial substrate made of a CZ single crystal silicon rod which is heated from 800° C., at which it was loaded, to 1100° C. at a temperature-rise rate of 4° C./minute and then subjected to a water vapor oxidizing treatment for 60 minutes so that OSFs occur in a density of not less than $100/cm^2$.

The present invention includes a semiconductor device that uses an epitaxial substrate formed as follows: an epitaxial layer is grown, on the surface of an epitaxial substrate according to the invention, and MOS-type devices are formed on this epitaxial layer.

The present invention makes it possible to increase the gettering property of an epitaxial substrate.

Moreover, in this case, even one portion of the silicon single crystal, which has been considered to be unusable conventionally, can be utilized effectively.

Moreover, in accordance with the present invention, MOS-type devices are assembled on the surface of an epitaxial layer stacked on the surface of the epitaxial substrate. For example, these are MOS transistors (nMOS, pMOS, CMOS). Therefore, this epitaxial substrate is capable of gettering impurities during the device process, thereby making it possible to improve the device characteristics of MOS, and the like.

DETAILED DESCRIPTION

Figure 1:
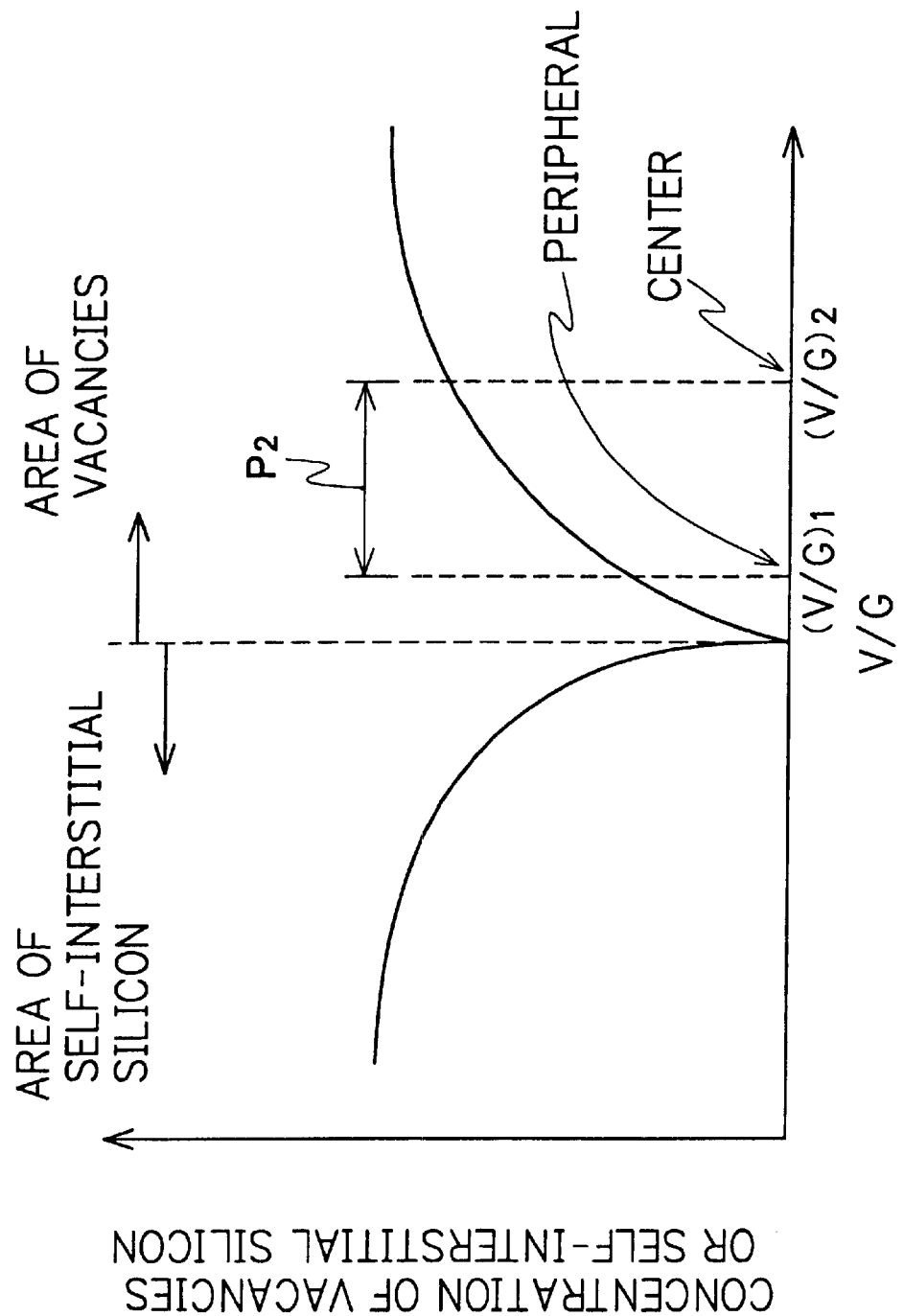
FIG. 1 is a graph showing the relation between V/G and concentration of vacancies or self-interstitials in a state in which single crystal silicon of one embodiment of the present invention is grown.

In accordance with an embodiment, the following description will discuss an epitaxial substrate of the present invention. FIGS. 1 through 6 are used for explaining this embodiment.

A silicon wafer, used as an epitaxial substrate of the present invention, is formed as follows: a silicon ingot is grown from a silicon molten liquid inside a hot zone furnace (crucible) by the CZ method in accordance with a predetermined pulling-velocity profile based upon Voronkov's theory, and this ingot is then sliced to form the silicon wafer.

In general, when a silicon single crystal ingot is grown from a silicon molten liquid inside a hot zone furnace by the CZ method, point defects and agglomerates of point defects (that is, three-dimensional defects) occur as defects in the silicon single crystal. The point defects are generally classified into two types, that is, vacancies and self-interstitial silicon. The vacancies are caused by a silicon atom that is dislocated from its normal position in the silicon crystal lattice. A vacancy results in a vacancy-type point defect. When an atom is found at a position (interstitial site) other than the lattice points of the silicon crystal, it is referred to as a self-interstitial silicon atom defect.

In general, the concentration of the point defects are in a crystal is in equilibrium just after solidification. However, as the ingot is continuously grown, a portion forming the contact face starts to cool. During this cooling period, vacancies of self-interstitial silicon aggregates, thereby forming agglomerates of vacancies or agglomerates of self-interstitial silicon. In other words, the agglomerates have a three dimensional structure caused by the agglomerates of point defects.

The agglomerates of vacancies include defects that are referred to as COP (Crystal Originated Particle), LSTD (Laser Scattering Tomograph Defect) and FPD (Flow Pattern Defects). The agglomerates of self-interstitial silicon include defects that are referred to as LD (Interstitial-type Large Dislocation).

COPs appear as pits caused by agglomerates of vacancies on the wafer surface when a silicon wafer having been mirror ground is washed with a solution of ammonia and hydrogen peroxide.

LSTDs are defects forming a source that has a refractive index different from that of silicon so that it generates diffused light upon application of infrared rays to the silicon single crystal.

FPDs are defects forming a source of traces having a peculiar flow pattern that appear upon etching a silicon wafer with a SECCO etchant for thirty minutes.

LDs are defects caused by large dislocations, and also referred to as dislocation clusters, or dislocation pits, since pits are formed when a silicon wafer having such defects is immersed into a selective etchant containing hydrofluoric acid as its main component.

In Voronkov's theory, in order to grow an ingot that has a smaller number of defects, supposing that the pulling velocity of the ingot is V (mm/min.) and that the temperature gradient at the interface between the ingot and the silicon molten liquid is G (° C./mm) in a hot zone structure, an attempt is made to control the ratio V/G (mm$^2$/min. ° C.) of the pulling velocity to the temperature gradient.

In FIG. 1, the vacancy concentration and the self-interstitial silicon concentration are graphically indicated as a function of V/G. In this theory, the border between the vacancy area and the self-interstitial silicon area in the wafer is determined by V/G.

More specifically, when V/G is set to a value not less than the critical value, ingots having vacancies dominantly are formed. When V/G is set to a value less than the critical value, ingots having self-interstitial silicon dominantly are formed.

The pulling velocity profile of silicon ingots in accordance with the present invention is determined as follows: V/G is determined so as to be maintained from not less than a first critical value (V/G), at which the generation of agglomerates of self-interstitial silicon is prevented to not more than a second critical value (V/G)$_2$ at which the generation of agglomerates of vacancies is limited.

The pulling velocity profile is determined based upon Voronkov's theory through a simulation process in which a reference ingot is sliced in the axial direction. In other words, after the simulation process, the results of slicing in the axial direction and the resulting sliced wafer are evaluated, and the simulation process is further repeated; thus, the profile is determined. For the simulation processes, a plurality of pulling velocities are set within a predetermined range so that a plurality of reference ingots are grown.

Figure 2:
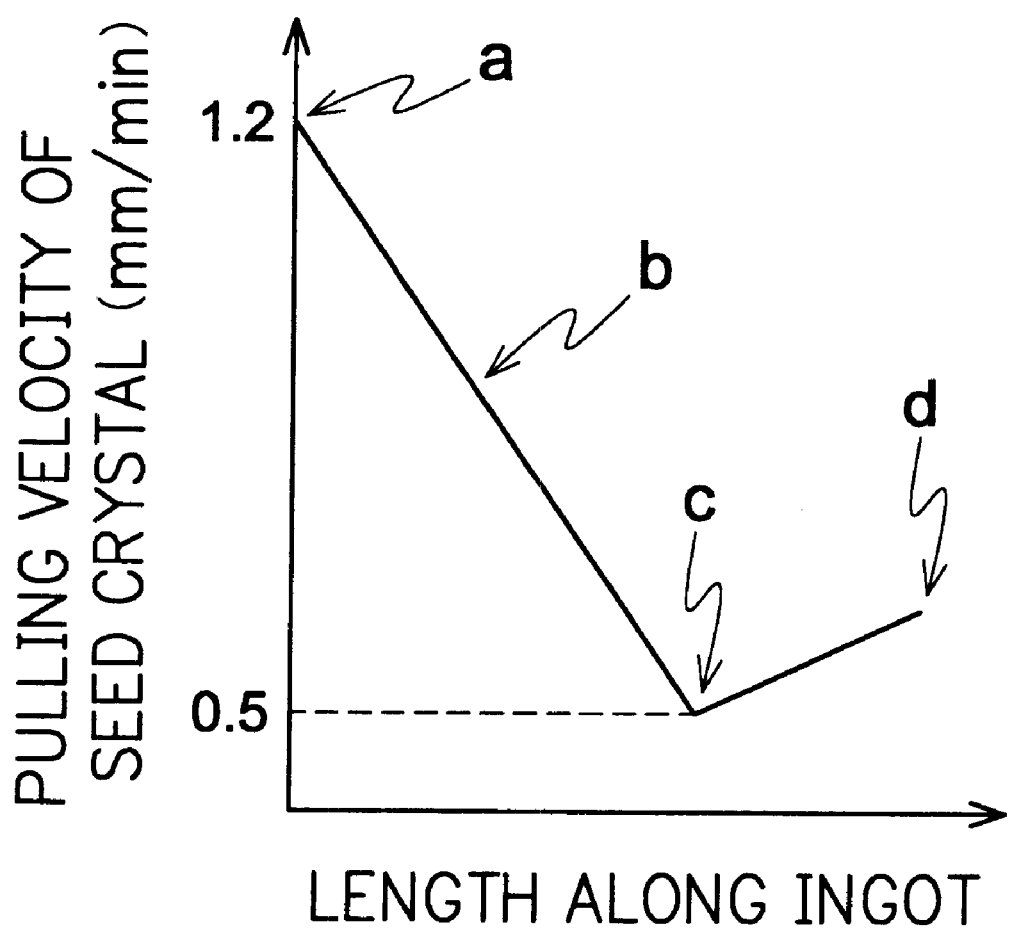
FIG. 2 is a graph showing a velocity profile of the single crystal silicon rod of one embodiment of the present invention in the state of growing the ingot.

As illustrated in FIG. 2, in accordance with the growth of the ingot, the pulling velocity profile for the simulation is adjusted from a high pulling velocity (a), such as 1.2 mm/min, to a low pulling velocity (c), such as 0.5 mm/min, and again to a high pulling velocity (d). The low pulling velocity may be set to 0.4 mm/min. or less. With respect to the changes at the pulling velocities (b) and (d), linear changes are preferably made.

The reference ingots that have been pulled at different velocities are sliced in the axial direction.

An optimal V/G is determined based upon the correlation among the slicing in the axial direction, the evaluation on the resulting wafer and the results of the simulations.

Then, an optimal pulling velocity profile is determined. Ingots are produced in accordance with the profile.

Figure 3:
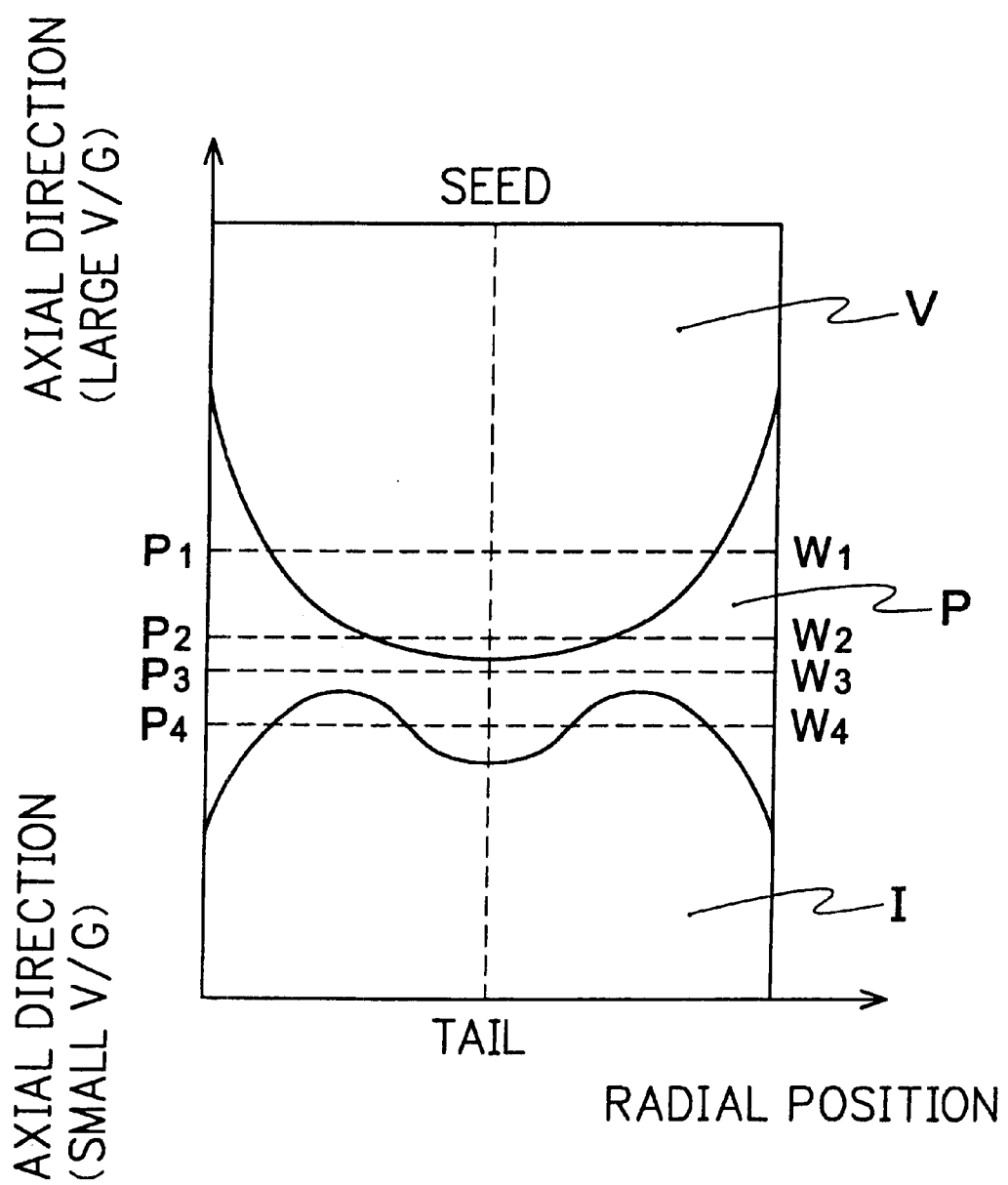
FIG. 3 is a sectional diagram showing a rod of one embodiment of the present invention in the case in which the pulling velocity of the ingot is gradually lowered.

FIG. 3 shows a cross-sectional view of the ingot when V/G is continuously reduced by gradually reducing the pulling velocity.

In FIG. 3, V represents an area in which vacancies dominantly exist inside the ingot, I represents an area in which self-interstitial silicon dominantly exist, and P represents a perfect area in which neither agglomerates of vacancies nor agglomerates of self-interstitial silicon exist.

As clearly shown by FIG. 3, wafer $W_1$ corresponding to position $P_1$ contains the area in which vacancies dominantly exist in the center thereof. Wafer $W_4$ corresponding to position $P_4$ contains a ring in which self-interstitial silicon dominantly exists and a perfect area in the center. Moreover, wafer $W_3$ corresponding to position $P_3$ forms a perfect area as a whole since it has neither agglomerates of vacancies in the center nor agglomerates of self-interstitial silicon at its edge portion. Wafer $W_2$ corresponding to position $P_2$ contains an area in which vacancies dominantly exist covering an area of ½(50%) of the wafer total area in the center as compared with wafer $W_1$.

This perfect area P, which is a narrow area between the areas V and I, is an area in which neither COPs nor LDs occur within the wafer plane.

When wafer $W_2$ was subjected to a thermal treatment at temperatures of 1000° C.±30° C. for two to five hours in an atmosphere of oxygen in accordance with a conventional OSF emphasizing thermal treatment and than is further subjected to a continuous thermal treatment at temperatures of 1130° C.±30° C. for 1 to 16 hours, OSFs occurred.

Figure 4:
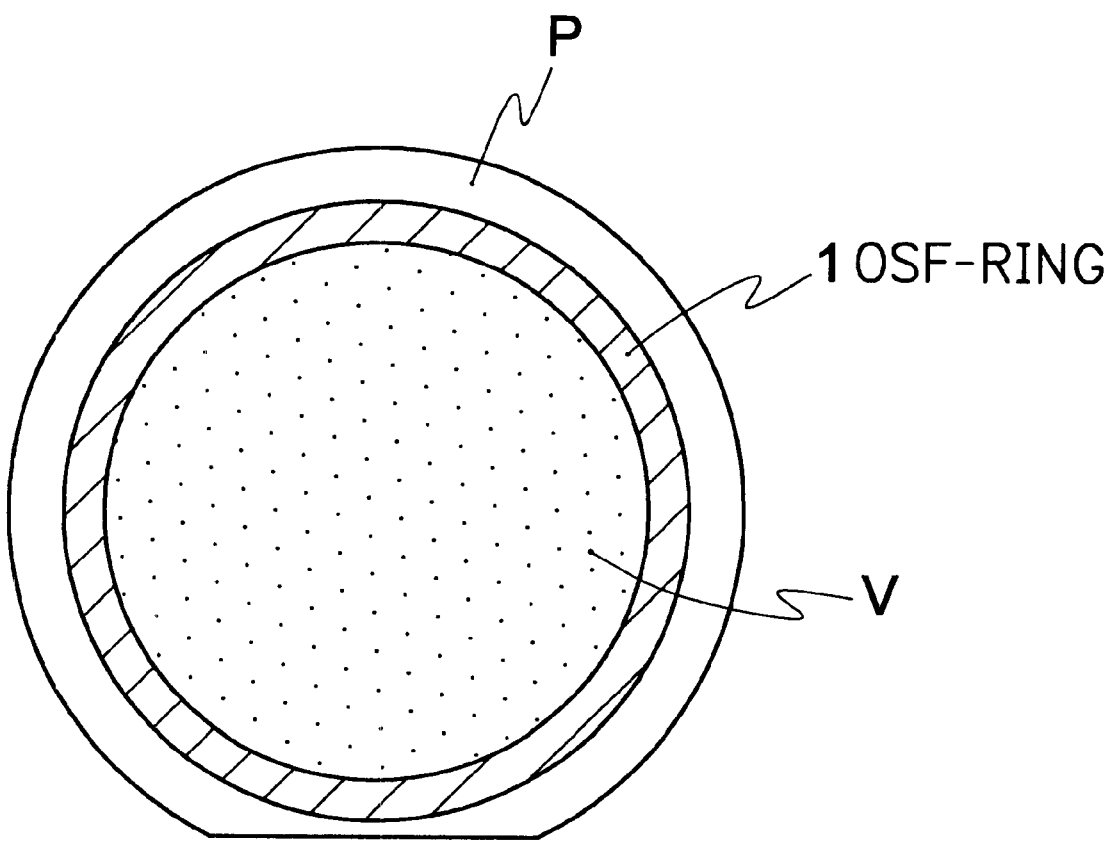
FIG. 4 is a plan view illustrating a wafer made of a single crystal silicon rod of one embodiment of the present invention.

As shown in FIG. 4, in wafer $W_1$ these OSFs are formed in a ring shape on the periphery of the wafer. In the area surrounded by the OSF ring in which vacancy defects exist dominantly, COPs tend to occur. In contrast, in case of wafer $W_2$, OSFs occur not in a ring shape, but in a disk shape in the center of the wafer.

The silicon wafer used in this invention is wafer $W_1$ or wafer $W_2$. In case of wafer $W_2$, OSFs occur in an area covering not less than 25% of the total area of the wafer. The occurrence of OSFs in an area less than 25% of the total area of the wafer makes the area of occurrence of oxygen deposits (BMD: Bulk Micro Defects) smaller, failing to obtain a sufficient IG (Intrinsic Getter) effect. The occurrence of OSFs is preferably set in the range of 50 to 80% of the wafer total area.

Figure 5:
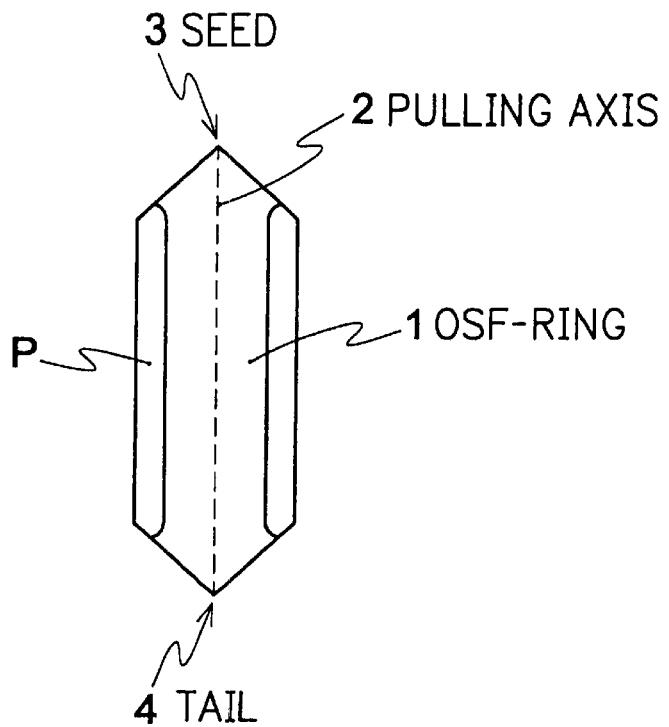
FIG. 5 is a side sectional view illustrating a single crystal silicon rod of one embodiment of the present invention.

Silicon wafer $W_2$ in this invention is formed by slicing an ingot that has been grown based upon a pulling velocity profile that was selected and determined so that OSFs are formed not in a ring shape, but in a biased manner in the center as shown in FIG. 5.

In FIG. 5, numeral 2 denotes a pulling axis of the silicon rod, 3 a seed crystal position, 4 a tail.

Figure 6:
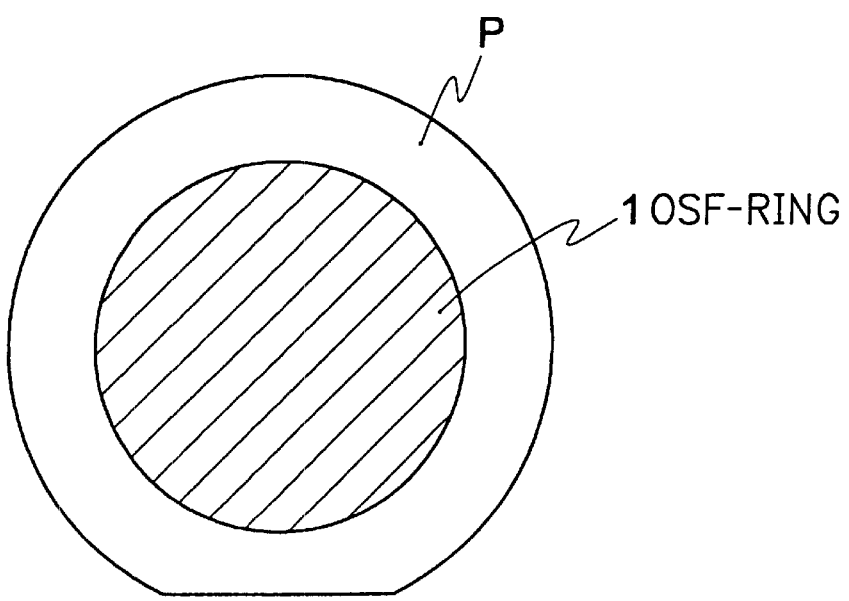
FIG. 6 is a plan view illustrating a single crystal silicon rod of one embodiment of the present invention.

FIG. 6 is a plan view thereof.

In this silicon wafer $W_2$, since the OSFs are not formed in a ring shape, it is free from COPs. Moreover, it is also free from the occurrence of LDs (Large Dislocations).

The ingot from which silicon wafer $W_2$ in this invention is formed contains oxygen precipitates not accompanying the occurrence of dislocations at a rate of $1 \times 10^5$ to $3 \times 10^7/\text{cm}^3$.

For this reason, different from Japanese Unexamined Patent Publication No. Hei: 8-45945, it is not necessary to introduce oxygen precipitate nuclei into the wafer at a high density after having been maintained for 0.5 to 20 hours at comparatively low temperatures of 500 to 800° C. in a wafer state prior to a quick heating process.

A BMD density less than $1 \times 10^5/\text{cm}^3$ fails to obtain a sufficient IG effect at the time of the quick heating process in a wafer state. Moreover, a BMD density of $3 \times 10^7/\text{cm}^3$ is the greatest possible BMD density that could be formed in the OSF area.

Next, the single crystal silicon ingot that has been pulled under the conditions determined as described above was sliced, lapped, so that silicon wafers are formed at each length position in the axial direction. The OSF density of this silicon wafer was measured. The measurements were carried out in the following method.

Namely, each silicon wafer was heated from 800° C., at which it was loaded, to 1100° C. at a temperature-rise rate of 4° C./minute and then subjected to a water vapor oxidizing treatment for 60 minutes. After the oxidized film had been removed with an HF solution, the OSFs were selectively etched with a SECCO etchant or a SCHIMMEL etchant, and the wafer OSF density was measured with an optical microscope.

Figure 7:
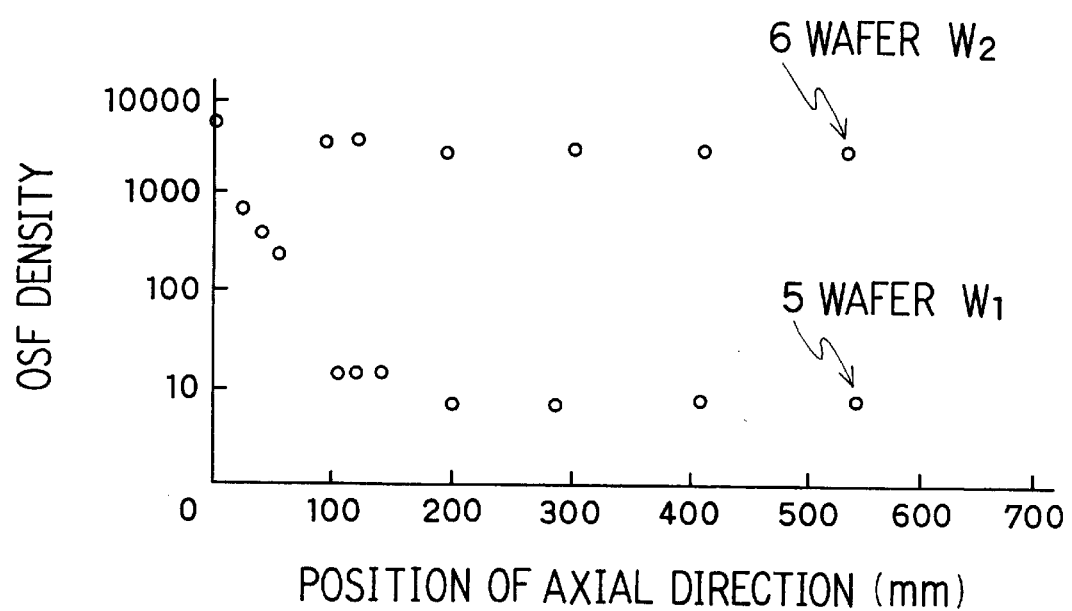
FIG. 7 is a graph showing OSF density of a single crystal silicon rod of one embodiment of the present invention.

FIG. 7 shows a distribution of the OSF density in the axial direction of the single crystal silicon rod.

In FIG. 7, numeral 5 denotes an OSF density of wafer $W_1$, 6 that of wafer $W_2$.

Moreover, an epitaxial layer was grown on each silicon wafer under the following conditions:

Furnace used: multi-wafer furnace
Temperature: 1000° C. to 1200° C.
Pressure: $4 \times 10^3$ to $1 \times 10^5$ Pa
Heating treatment time: 5 to 30 minutes
Gas: $SiH_2Cl_2$ or $SiH_3Cl_3$
Epitaxial growth rate: 0.1 to 6.0 $\mu$m/mm
Layer thickness: 0.5 to 20 $\mu$m This epitaxial wafer was used to manufacture a 64 MDRAM using a known method, and tests on the leakage defect rate and the device yield were carried out by using known methods. Here, the DRAM was composed of switching-use MOS transistors and capacitors.

Figure 8:
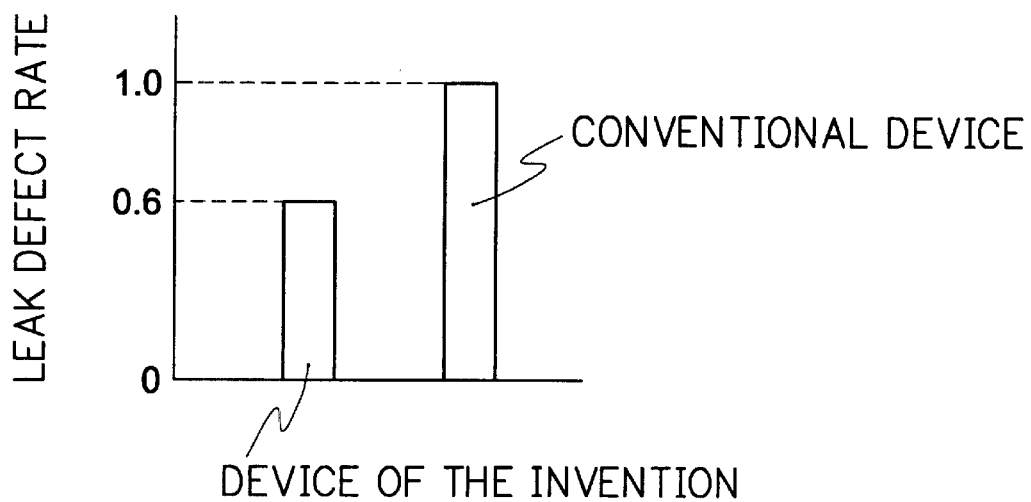
FIG. 8 is a graph showing a leakage defect rate of an epitaxial wafer using an epitaxial substrate of one embodiment of the present invention.
Figure 9:
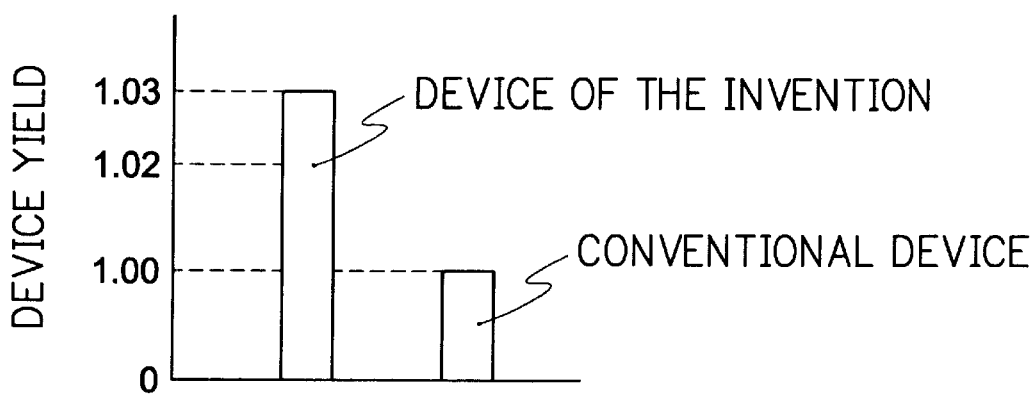
FIG. 9 is a graph showing device yield of an epitaxial wafer using an epitaxial substrate of one embodiment of the present invention.

FIGS. 8 and 9 show the results of the tests.

Moreover, as a comparative example, a test wafer was obtained from a single crystal silicon rod that had been grown under the following conditions through the same process as described above.

At this time OSFs of the wafer were $82/\text{cm}^2$.

This wafer was subjected to an epitaxial growth under the same conditions as those of the embodiment.

Moreover, the same tests as described above were carried out on this epitaxial wafer. The results are shown in FIGS. 8 and 9.

As clearly shown by these Figures, it is confirmed that the epitaxial wafer using the epitaxial substrate of the present invention is superior in the device yield and leakage defect rate.

In accordance with the present invention, a conventionally unused portion of the CZ silicon crystal can be effectively utilized. Moreover, it is possible to manufacture a substrate for an epitaxial wafer having a high gettering property. In this case, a simple manufacturing process is achieved. Further, it is possible to uniformly distribute OSFs within the wafer plane by using the above-mentioned crystal growth conditions.

What is claimed is:

1. A substrate for epitaxial growth having a surface on which an epitaxial layer is to be grown, wherein said substrate is cut from a single crystal silicon rod grown by the Czochralski method and includes oxygen-induced stacking fault (OSF) defect nuclei in a density of $10^5$ to $3 \times 10^7/\text{cm}^3$, confined to a centrally located disk-shaped area of the substrate, and occupying 25% to 80% of total substrate area.

2. The substrate for epitaxial growth of claim 1, wherein the OSF defect nuclei occupy between 50% and 80% of the total substrate area.

3. A substrate for epitaxial growth having a surface on which an epitaxial layer is to be grown, wherein said substrate is cut from a single crystal silicon rod grown by the Czochralski method and is heated from 800° C. to 1100° C. at a temperature-rise rate of 4° C./minute and then subjected to a water vapor oxidizing treatment so that oxygen-induced stacking faults (OSFs) are produced in a density of not less than $100/\text{cm}^2$, the substrate including OSF defect nuclei in a density of $10^5$ to $3 \times 10^7/\text{cm}^3$, confined to a centrally located disk-shaped area of the substrate, and covering not less than 25% of total substrate area.

* * * * *